United States Patent [19]

Zielinski

[11] 4,019,798

[45] Apr. 26, 1977

[54] FLEXIBLE ELECTRICAL CIRCUIT CONNECTIONS

[75] Inventor: Eugene J. Zielinski, Toledo, Ohio

[73] Assignee: Owens-Illinois, Inc., Toledo, Ohio

[22] Filed: Mar. 24, 1976

[21] Appl. No.: 669,950

[52] U.S. Cl. .................... 339/17 F; 339/176 MF
[51] Int. Cl.² ........................................ H05K 1/12
[58] Field of Search ............ 174/117 PC; 339/17 F, 339/75 R, 75 M, 75 MP, 176 MF

[56] References Cited

UNITED STATES PATENTS

| | | | |
|---|---|---|---|
| 3,221,286 | 11/1965 | Fedde | 339/17 F |
| 3,602,870 | 8/1971 | Willard | 339/17 F |
| 3,749,959 | 7/1973 | Schmersal | 174/117 PC |
| 3,772,776 | 11/1973 | Weisenburger | 174/117 PC |
| 3,851,294 | 11/1974 | Palazzetti | 339/176 MF |

Primary Examiner—Roy Lake
Assistant Examiner—Mark S. Bicks
Attorney, Agent, or Firm—Steve M. McLary; Edward J. Holler

[57] ABSTRACT

A system for the connection of flexible electrical circuits to electrical components, particularly gas discharge panels. Flexible circuits are used to carry electrical signals to and/or from various electrical components. In the case of gas discharge panels, the flexible circuits must be carefully and securely held in a fixed position to mate with thick film termination pads from the multiple thin film operating electrodes. The present invention discloses the utilization of a clip member as a major component of a total system for securing such flexible circuits to, as an example, a gas discharge panel.

2 Claims, 8 Drawing Figures

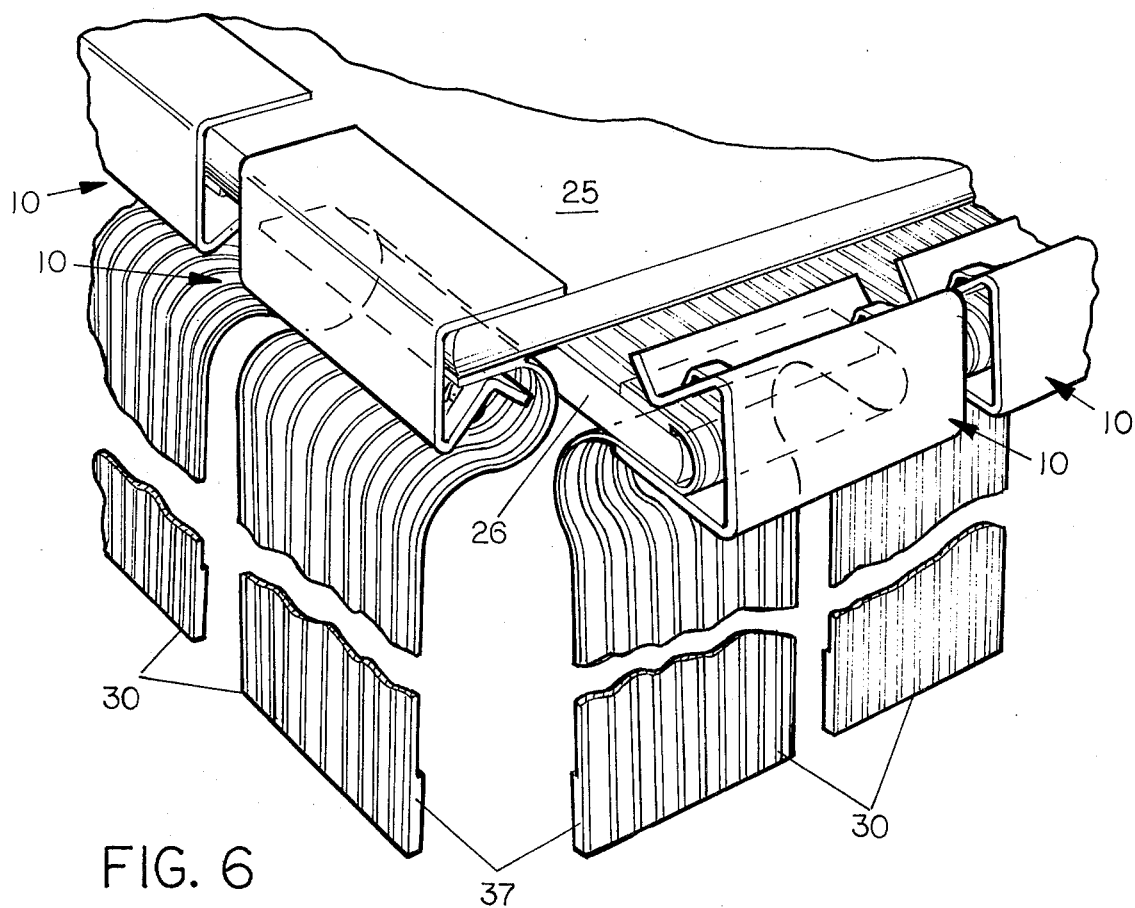
FIG. 6
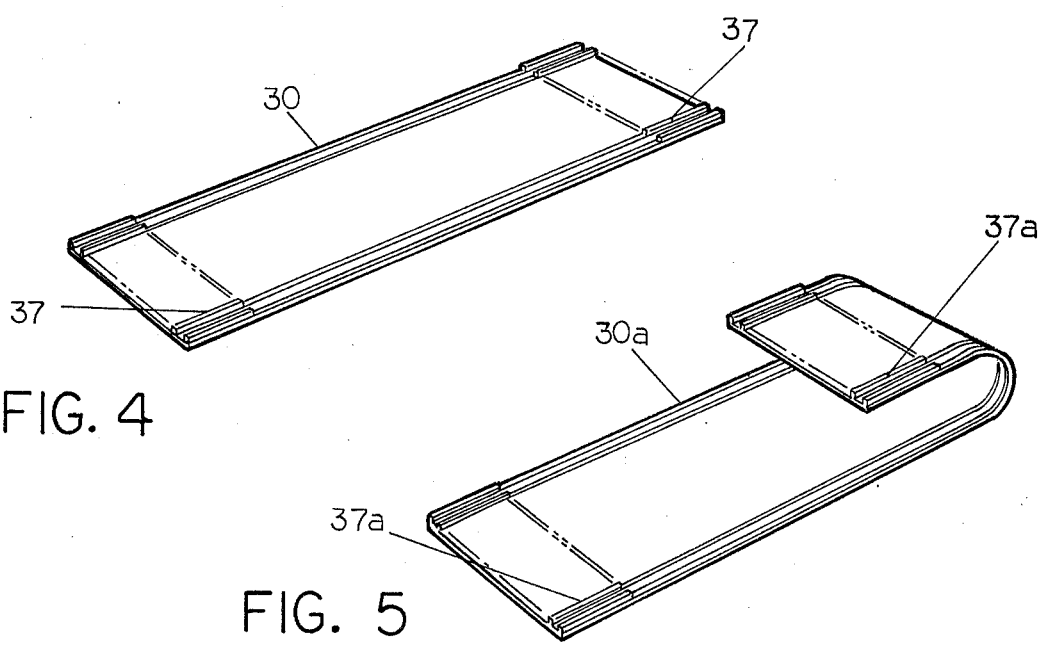
FIG. 4
FIG. 5

FLEXIBLE ELECTRICAL CIRCUIT CONNECTIONS

BACKGROUND OF THE INVENTION

This invention generally relates to the connection of flexible circuits which carry electrical signals to electrical components. More particularly, this invention relates to the connection of such flexible circuits to gas discharge panels. Yet more specifically, this invention relates to the connection of such flexible circuits to gas discharge panels by a system using clip members as major components.

The use of flexible cables to carry electrical signals to and/or from electrical components such as printed circuit boards is known in the art. The cables may also contain circuit components such as resistors, capacitor and diodes, so the more general term flexible circuits is more accurate as including both the simple conductor type and the more complex type with circuit elements. In the prior art, U.S. Pat. No. 3,749,959 shows one system for attaching such flexible circuits to gas discharge panels. This system, while practical and useful, does have some disadvantages. It requires, as will be demonstrated later, flexible circuits of two different types for a single gas discharge panel. In addition, the bonding technique of the reference patent did not allow easy removal of flexible circuits for repair or replacement should they or the gas discharge panel prove defective in initial tests. I have developed a system by which the flexible circuits are held in place on the panel by a clip member which exerts spring force to so hold the flexible circuits. A force distribution means aids in preventing damage to the panel or the flexible circuit due to the spring force. I have also invented a tool by which the clip may be easily applied to the gas discharge panel.

SUMMARY OF THE INVENTION

My invention finds utility, in one embodiment, in gas discharge panels of the type having a pair of elongated flat glass plates that are spacedly joined to form a thin gas discharge chamber. The gas discharge panel includes a plurality of conductors which extend parallel to the long direction of each of the plates and terminate in mounting pads which are exterior of the location where the plates are joined. The plates are joined with their long axis being transverse. My specific invention is an improvement in such gas discharge panels to provide an improved system for the connection of the panels to external electrical signals. A flexible circuit means is connected to the external electrical signals and has multiple conductors which terminate in pads that correspond in spacing to the spacing of the mounting pads on the plates. An adhesive means holds the pads of the flexible circuit means in alignment with the mounting pads on the plates. Clip members secure the flexible circuit means in position by application of a spring force on the flexible circuit means and the plates. Finally, a force distribution means is positioned between the flexible circuit means and the clip member to prevent concentration of spring forces from the clip member onto the flexible circuit means and the mounting pads on the plates.

BRIEF DESCRIPTION OF THE DRAWINGS

FIG. 4 is a perspective view of one type of flexible circuit having pads on a common side;

FIG. 5 is a perspective view, with one end curled upward for clarity, of a second type of flexible circuit, the use of which the present invention makes optional, having pads on opposite sides;

FIG. 6 is a perspective view, similar to FIG. 3, illustrating the connection of flexible circuits to a gas discharge panel utilizing the present connection system and using only a single type of flexible circuits, that shown in FIG. 4;

DETAILED DESCRIPTION OF THE DRAWINGS

Figure 1:
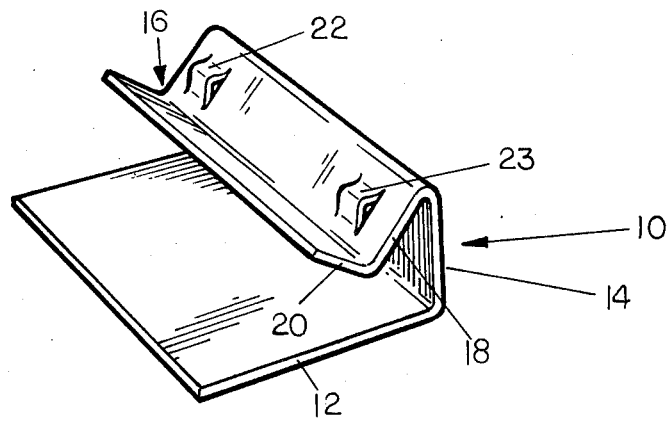
FIG. 1 is a perspective view of the clip member of the present invention.

Reference is once more made to U.S. Pat. No. 3,749,959, the teachings of which are hereby incorporated by reference. As was peviously noted, this specific patent illustrates the general operational environment of the present invention. It furthermore discloses a technique which is an alternative to that presented by the present invention, but a technique which has proven to have drawbacks and which has not been completely satisfactory to date. In the drawings which accompany the following discussion, many dimensions have been grossly exaggerated in the interest of clarity of explanation. Those skilled in the art will easily recognize where such distortions occur, particularly in the illustration of the various connection pads involved.

As clip member 10 which is a major component of the present invention is seen in FIG. 1. The clip member 10 is preferably manufactured from a spring type steel such as C1075, and may be made of material of approximately 0.020 inch in thickness. The clip member 10 includes an elongated, generally rectangular bottom member 12. Connected to and integrally formed with the bottom member 12 is an upstanding wall member 14 which is positioned at approximately 90° with respect to the bottom member 12. Connected to the upper terminus of the wall portion 14 and again formed as an integral assembly is a generally V-shaped spring portion 16 with the notch pointing downward toward the bottom member 12. The spring portion 16 is generally configured such that the distance from the bottom of the V or the notch to the top of the bottom member 12 is somewhat less than half the total height of the wall 14. This helps insure adequate spring forces in the application of the clip 10. Additionally, a downwardly extending leg 18 of the spring portion 16 is preferably slightly longer than an upwardly extending leg 20. The particular configuration of the clip member 10 seen in FIG. 1 includes punched out ear portions 22 and 23 which are formed from the material of the downwardly extending leg 18. With these ears 22 and 23 available, it is conceivable that wire form handles could be inserted into these ears 22 and 23 for opening or biasing the spring portion 16 into an open position for its application. However, as will be pointed out later, this is not a preferred configuration since the ears 22 and 23 add unnecessary complexity to the clip member 10 and consequently increase its cost. Furthermore, the clip member 10 is preferably made as an extremely stiff member and it is physically difficult to produce sufficient pressure with wire form handles acting on the ears 22 and 23 to open the spring portion 16. In the preferred mode of operation, the ears 22 and 23 are absent, and a specific application tool is utilized.

Figure 2:
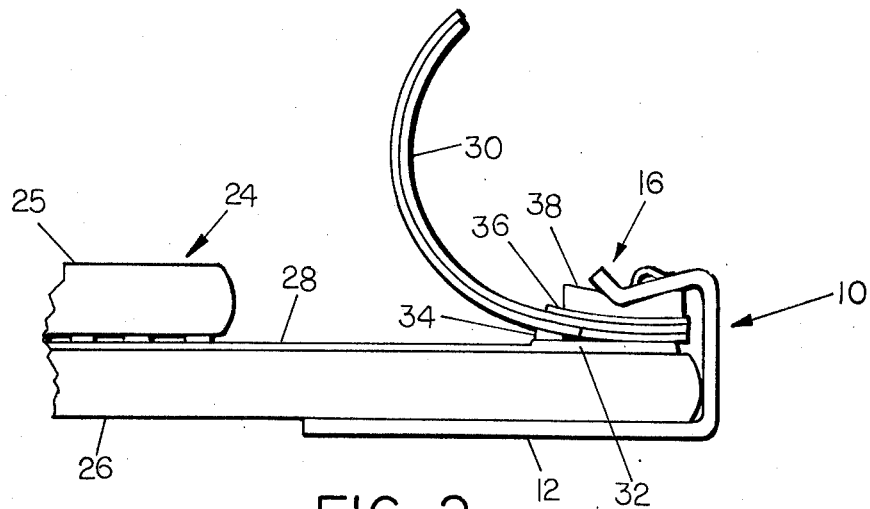
FIG. 2 is a cross sectional, elevational view of a gas discharge panel using the connection system of the present invention.

The cross sectional view of FIG. 2 best illustrates the present invention in its completed form. The patent previously noted and incorporated by reference was specifically designed to allow the connection of flexible termination circuits to gas discharge display panels. This is also the purpose of the present invention. However, the present invention should not be thought of as being strictly limited to gas discharge panels. The techniques disclosed herein are applicable to any electrical connection requirement, using flexible circuits as for example in printed circuit boards. A gas display panel 24 has upper and lower plates 25 and 26. In the view of FIG. 2, a thin film electrode 28 is seen as extending along the upper surface of the lower plate 26. Those skilled in the art of such display panels recognize, of course, that there are a multiplicity of such thin film electrodes extending from both the upper plate 25 and the lower plate 26 to areas beyond the active display area for connection to input and/or output electrical circuitry through thick film pads. The input and output signals are most typically furnished by multiconductor flexible circuits such as that shown at 30 in FIG. 2. The flexible circuit 30 will be referred to as a flexible circuit as opposed to a flexible conductor, since it is possible that some electronic functions may be performed within this member as opposed to the member simply providing a conduit for the flow of electricity. In the most general sense, the term flexible circuit would include simple flexible conductors which transmit electricity as well as those which include some electronic components for the modification of signals as they travel through the flexible circuit 30.

One of the most important aspects of the present invention is that it allows assembly of the flexible circuit 30 to the gas display panel 24 in such a manner that no element of the attaching means, save the relatively thin bottom member 12, extends beyond the surfaces defined by the upper and lower panels 25 and 26. That is, no portion of the clip 10 extends above the upper most portion of the upper panel 25. This is extremely important since many of these display panels 24 are mounted in areas which require that the upper panel 25 be flush with some mounting device. All elements which are used to secure the flexible circuits 30 to the panel 24 therefore must lie below a plane which is defined by the upper surface of the upper plate 25. To date, this has proven extremely difficult, and the permanent bonding techniques described in the referenced patent have been one of the best methods so far developed to achieve this goal. However, such permanent bonding techniques are extremely inflexible in that they do not allow easy removal of a flexible circuit 30 for repair or replacement, nor do they allow removal of the flexible circuits 30 from a panel 24 which may be found to be defective upon initial testing without risk of damage to the thick film pads. It can be seen that the present invention provides a removable attachment for the flexible circuit 30 in that the clip 10 may be removed and a defective flexible circuit 30 be replaced without significant difficulty. Likewise, the desired positioning of all mounting means for the flexible circuit 30 below the plane defined by the upper plate 25 is also achieved.

In FIG. 2, the thin film electrode 28 terminates in a thick film pad 32. In actual fact, those skilled in the art are well aware, a plurality of thin film electrodes each terminate with a common thick film pad 32. There are a plurality of such termination points along the length of both the upper and lower plates 25 and 26 to which the flexible circuits 30 are attached. All termination pads or connections are first carefully cleaned to prevent erratic contact due to dust or oil particles. A relatively thin layer 34 of an adhesive is first applied to the top portion of the thick film pad 32. The flexible circuit 30 is then aligned with the thick film pad 32 and pressed in place with the adhesive 34 serving to hold this initially aligned relationship. This bond is not permanent in nature and is strictly designed to secure the flexible circuit 30 until a more permanent mounting means may be attached. It would be possible, if desired, to form a permanent glue joint at this time or to "pot" the assembly at this time. The clip 10 would then be used as an added holding feature. Such an extreme form of bonding system might be used for very hostile environmental requirements or for severe MIL specs. An electrical insulator 36, which may have an adhesive backing, is then preferably placed on top of the flexible circuit 30 generally adjacent to the thick film pad 32. A resilient force distribution means 38, which may be a relatively thin pad of silicone rubber approximately one thirty-second of an inch thick, is then placed in position over the thick film pad 32. The force distribution means 38 may have an adhesive back to hold it in place. Finally, the clip member 10 is attached to the panel 24. The wall portion 14 is less in height than the thickness of both plates 25 and 26. It may be seen that the bottom member 12 overlaps the edge of the lower plate 26 and is tightly held against the lower plate 26. This tight holding action is provided by the spring portion 16 which bears against the top of the lower panel through the force distribution means 38, insulator 36, flexible circuit 30, adhesive means 34, and the thick film electrode 32. The purpose of the force distribution means 38 is to prevent a concentration of load upon the flexible circuit 30 at precisely the bottom of the V-notch. It should be realized that such a concentration of forces could lead to partial or total destruction of parts of the flexible circuit 30, or could possibly damage the thick film pad 32. The force distribution means 38 further helps compensate for surface discontinuities and any imperfect matches between the thick film pad 32 and the flexible circuit 30. The insulator 36 may be omitted in some cases if the electrical insulation properties of the force distribution means 38 proves sufficient.

It is well known that the total number of thin film electrodes terminating at a given location may vary from panel to panel. Additionally, the width of a flexible circuit 30, which is directly related to the number of thin film electrodes with which it is related, may also vary from panel to panel. Thus, the overall lengths of the clip member 10 will be set to correspond to the width or number of total circuits carried by the flexible circuit 30.

Figure 3:
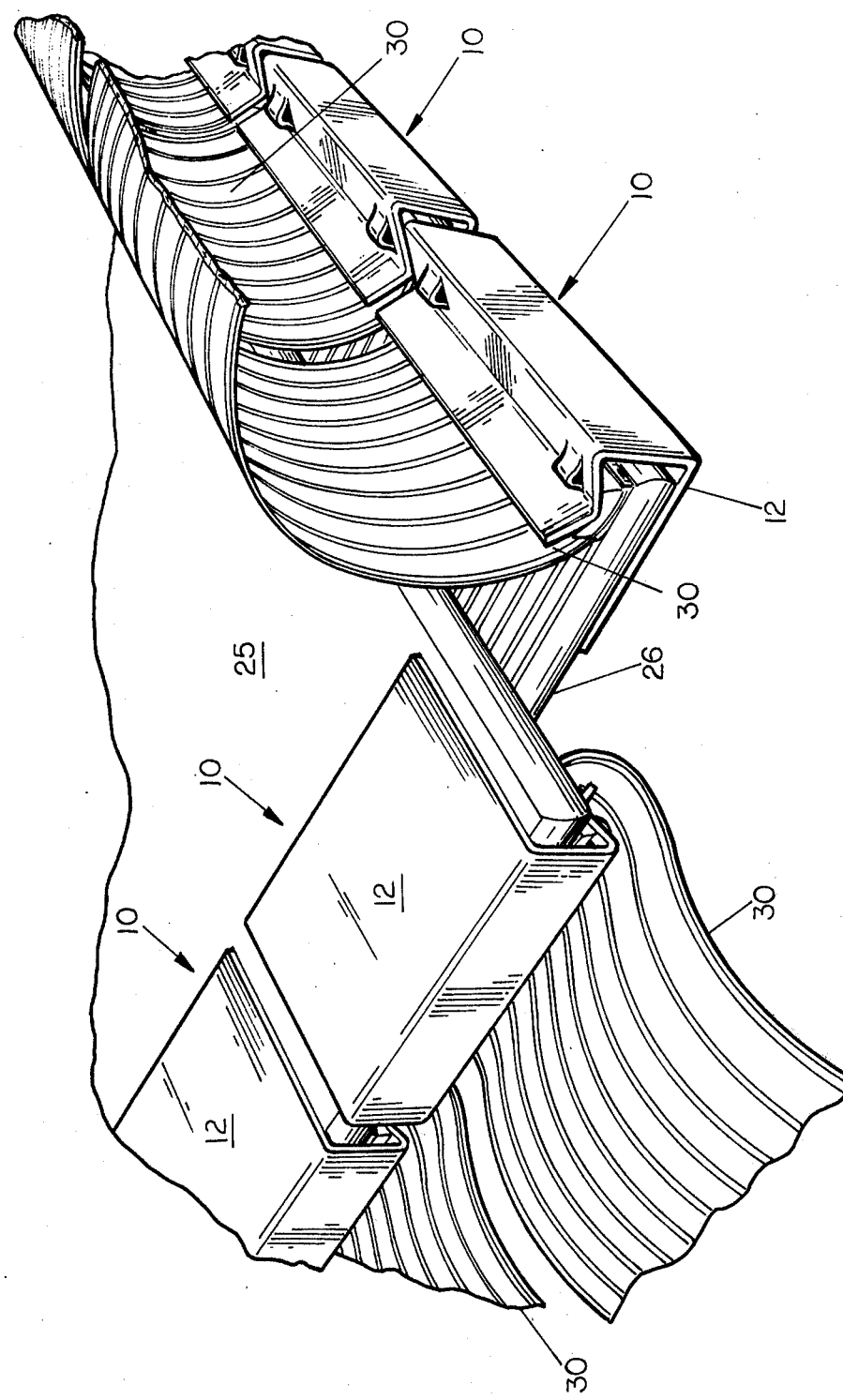
FIG. 3 is a perspective view illustrating a gas discharge panel having flexible circuits connected thereto by the connection system of the present invention.

FIG. 3 is a much enlarged view of one end of the display panel 24 illustrating how the present invention would be used to secure flexible circuits 30 to both upper plate 25 and lower plate 26. Note that in both circumstances, the only projection beyond the plane of the panels themselves is the relatively thin bottom member 12 of the clip 10. It can be seen that a plurality of flexible circuits 30 are used to connect with the plurality of the electrodes which are a part of both upper and lower plates 25 and 26. One point to be made is that although all of the flexible circuits 30 are given the same numeral in FIG. 3, they may in fact perform different functions, and some may be simply electrical conductors while others are the more complex flexible circuits per se.

Yet another advantage of the present invention is that it allows use of only one type of flexible circuit 30. As FIG. 3 shows, the thick film pads 32 for the lower plate 26 face upward while the thick film pads 32 for the upper plate 25 face downward. The flexible circuit 30 also has mounting pads 37, as seen in FIG. 4, on the same side. In the assembly of the entire system, it is desirable that the pads 37 from the flexible circuits 30 from both the upper and lower plates face inward for mating with matrix boards. It is therefore required, in most systems, that two different types of flexible circuit 30 be used. The second type, designated as 30A, is shown in FIG. 5. The flexible circuit 30A had pads 37A on opposite sides rather than on the same side. In FIG. 3, the flexible circuits used for the lower plate 26 are actually of the type shown in FIG. 5.

FIG. 6 shows how the "single sided" type of flexible circuit 30 in FIG. 4 can be used. This type is desirable because it is lower in cost than the "double sided" type of flexible circuit shown in FIG. 5. The upper plate 25 is assembled exactly as in FIG. 3. In the case of the lower plate 26, the flexible circuit is made to extend under the bottom member 12 of the clip 10, thus having its length extending under the lower plate 26 as opposed to coming from the top of the lower plate 26, as shown in FIG. 3.

Figure 8:
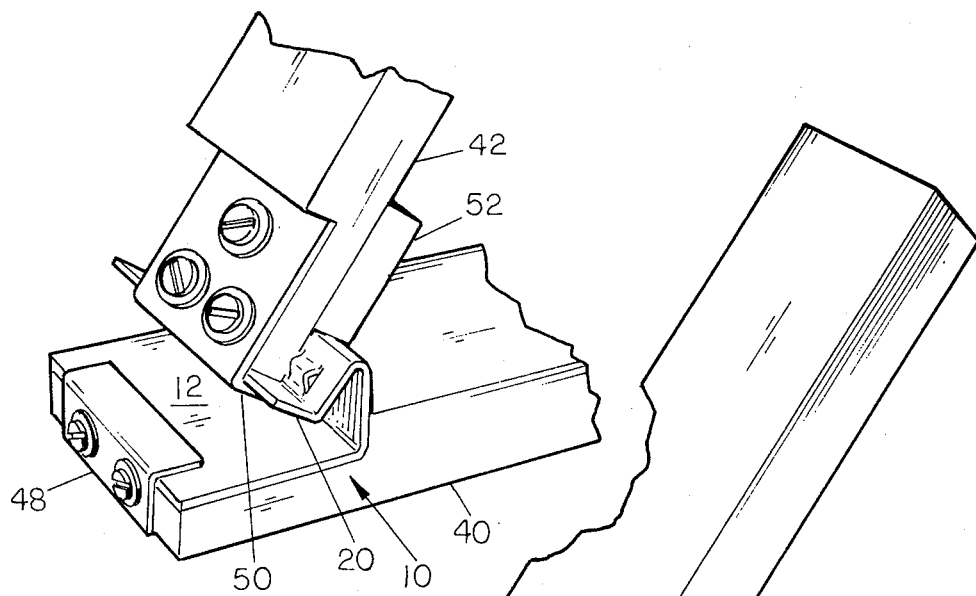
FIG. 8 is a view similar to FIG. 7 with the application tool fully engaged with the clip member.
Figure 7:
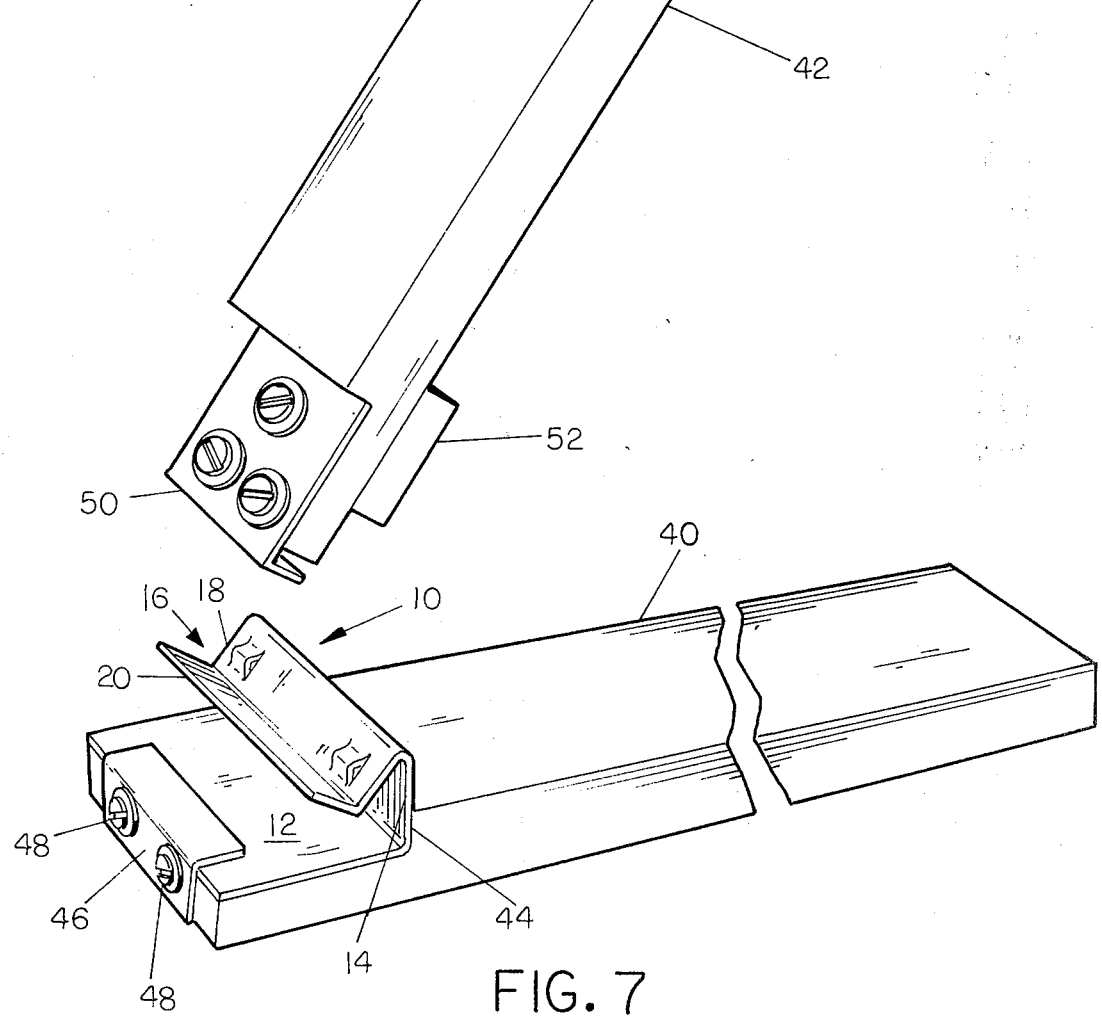
FIG. 7 is a perspective view of an application tool for attachment of the clip member of the present invention with the upper member being unattached.

FIGS. 7 and 8 illustrate a novel application tool which may be used in the application of the clip 10. The tool is actually made up of two separate portions, which for convenience in referring to their normal orientation, may be referred to as a lower member 40 and an upper member 42. The lower member 40 includes a cutout portion 44 which generally conforms in size to the bottom member 12 of the clip 10. The height or depth of the cutout 44 does not necessarily have to be as high as the upstanding wall portion 14, and in fact should not be so deep so as to prevent proper cooperation with the upper tool member 42. A hook 46 is attached to the open end of the cutout 44 and is positioned above the bottom of the cutout 44 a distance greater than the thickness of the material of the bottom member 12. The bottom member 12 may then be slipped under the hook 46 and held securely in position as seen in FIG. 7. The hook 46 is shown as being secured to the lower tool member 40 by screws 48, but any convenient securing technique can be used, and it is conceivable that the hook 46 could be made an integral part of the lower tool member 40. The upper tool member 42 also includes a hook 50. The hook 50 is generally downwardly directed with respect to the orientation of the upper tool member 42 as it is normally used. There is a gap provided between the face of the hook 50 and the end of the upper tool member 42. This space is set to be slightly wider than the thickness of the material which makes up the upwardly extending leg 20 of the spring portion 16. Positioned behind the hook member 50 is a fulcrum block 52. The distance between the hook 50 and the block 52 is set to be approximately equal to the distance between the outermost extension of the upwardly extending leg 20 and the back of the upstanding wall portion 14. This distance may also be defined as the appropriate width of the spring portion 16. As illustrated most graphically in FIG. 8, the hook 50 engages the upwardly extending leg 20 and the block 52 then positions itself behind the wall 14 at approximately its upper most point. It should be quite clear that a lever is created and by pulling downwardly on the upper tool member 42, the distance between the bottom of the V-notch and the bottom member 12 may be increased. While the clip 10 is held in this configuration, it may be slipped over the force distribution means 38. It would then be pushed forward until the upstanding wall 14 was stopped by the upper or lower plate 25 or 26 as the case might be. At this point, the operator could release pressure on the upper tool member 42 which would then allow the spring portion 16 to return to its normal position as seen in FIG. 2. While this is called the normal position, it is actually a slightly stressed position which will present the necessary spring force to hold the flexible circuit 30 in place. With this action done, the upper tool member 42 be easily removed and, with a slight springing of the bottom member 12, the lower tool member 40 may also be removed by a slight downward motion and a push forward. This entire installation procedure is very advantageous to the components involved since it is basically a zero insertion force system. There are no sliding forces nor are there any unusual normal forces encountered during the assembly.

I claim:

1. In a gas discharge panel having a pair of elongated flat glass plates spacedly joined to form a thin gas discharge chamber, wherein said plates are joined with their long axis transverse, wherein a plurality of conductors extend parallel to the long direction of each plate on the surface of each of said plates and terminate in mounting pads which are exterior of the location wherein said plates are joined, an improved system for the connection of said gas discharge panel to electrical signals which comprises, in combination:

flexible circuit means, having multiple conductors terminating in pads which correspond in spacing to the spacing of said mounting pads on said plate, for carrying electrical signals;

adhesive means for holding the pads of said flexible circuit means in alignment with said mounting pads on said plates;

clip members for securing said flexible circuit means in position by the application of spring forces on said flexible circuit means and on said plates, said clip members each including;

a bottom member underlying said glass plate on the side away from said plate mounting pads;

an upstanding wall portion extending toward said plate mounting pads and being of a height less than the combined thickness of said pair of flat glass plates; and a generally V-shaped spring portion connected to the upper marginal edge of said wall portion with the notch thereof pointing toward said flexible circuit means, said spring portion being defined by a downwardly extending leg attached to said upstanding wall portion and an upwardly extending leg, attached to the lower marginal edge of said downwardly extending leg, which is shorter in length than said downwardly extending leg; and force distribution means, positioned between said flexible circuit means and said clip members, for preventing concentration of spring forces from said clip members onto said flexible circuit means and said mounting pads on said plates and for compensating for any surface irregularities, said notch portion of said spring portion being in contact with said force distribution means.

2. In the gas discharge panel of claim 1, the improved connection system further includes:

an electrically insulating member positioned between said force distribution means and said flexible circuit means.

* * * * *